United States Patent
Asano et al.

(10) Patent No.: US 6,518,332 B2
(45) Date of Patent: Feb. 11, 2003

(54) SEMICONDUCTOR ENCAPSULATING EPOXY RESIN COMPOSITIONS, AND SEMICONDUCTOR DEVICES ENCAPSULATED THEREWITH

(75) Inventors: Eiichi Asano, Gunma-ken (JP); Kazutoshi Tomiyoshi, Gunma-ken (JP); Masachika Yoshino, Gunma-ken (JP); Toshio Shiobara, Gunma-ken (JP); Shoichi Osada, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 09/841,046

(22) Filed: Apr. 25, 2001

(65) Prior Publication Data

US 2002/0102429 A1 Aug. 1, 2002

Related U.S. Application Data

(63) Continuation of application No. 09/299,880, filed on Apr. 27, 1999, now abandoned.

(30) Foreign Application Priority Data

Apr. 27, 1998 (JP) .......................................... 10-132715

(51) Int. Cl.[7] .......................... C08K 3/10; C08L 63/02
(52) U.S. Cl. ...................... 523/442; 523/443; 523/458; 257/789; 257/793
(58) Field of Search .................. 523/458, 442, 523/443; 257/789, 793

(56) References Cited

U.S. PATENT DOCUMENTS

| | | | | |
|---|---|---|---|---|
| 492,732 | A | * | 2/1893 | Lytle |
| 2,766,139 | A | * | 10/1956 | Green, Jr. et al. |
| 3,373,135 | A | * | 3/1968 | Jenker et al. |
| 3,398,019 | A | * | 8/1968 | Langguth et al. |
| 3,726,694 | A | * | 4/1973 | Moore et al. |
| 4,632,946 | A | * | 12/1986 | Muench et al. |
| 5,360,837 | A | * | 11/1994 | Honda et al. |
| 5,434,199 | A | * | 7/1995 | Gallagher et al. |
| 5,476,884 | A | * | 12/1995 | Kayaba et al. |
| 5,567,749 | A | * | 10/1996 | Sawamura et al. |
| 5,739,186 | A | * | 4/1998 | Hayakawa et al. |
| 6,190,787 | B1 | | 2/2001 | Maeda ........................ 428/620 |

FOREIGN PATENT DOCUMENTS

| | | | |
|---|---|---|---|
| EP | 0926196 A1 | * | 6/1999 |
| JP | 59-182546 | * | 10/1984 |
| JP | 59-204633 | * | 11/1984 |
| JP | 60-80259 | * | 5/1985 |
| JP | 11-12436 | * | 1/1999 |
| JP | 11-21432 | * | 1/1999 |
| WO | 99/01507 | * | 1/1999 |

OTHER PUBLICATIONS

Markezich, R.L. et al.: Annu. Tech. Conf.—Soc. Plast. Eng., vol. 53, No. 3, 1195, pp. 3541–3543, XP000986646, (6/95).*

* cited by examiner

*Primary Examiner*—Robert Dawson
*Assistant Examiner*—D. Aylward
(74) *Attorney, Agent, or Firm*—Birch, Stewart, Kolasch & Birch, LLP

(57) ABSTRACT

Semiconductor encapsulating epoxy resin compositions comprising an epoxy resin, a phenolic resin curing agent, a fire retardant comprising zinc molybdate carried on spherical silica having a mean particle diameter of 0.2–20 $\mu$m and a specific surface of 1–20 m$^2$/g, and an inorganic filler are able to provide cured products having excellent fire retardance. The compositions have good flow and curing properties and excellent reliability and do not pose a hazard to human health or the environment.

12 Claims, No Drawings

SEMICONDUCTOR ENCAPSULATING EPOXY RESIN COMPOSITIONS, AND SEMICONDUCTOR DEVICES ENCAPSULATED THEREWITH

BACKGROUND OF THE INVENTION

This application is a continuation of application Ser. No. 09/299,880, filed on Apr. 27, 1999, now abandoned, the entire contents of which are hereby incorporated by reference and for which priority is claimed under 35 U.S.C. § 120; and this application claims priority of Application No. 10-132715 filed in Japan on Apr. 27, 1998 under 35 U.S.C. § 119.

FIELD OF THE INVENTION

The present invention relates to semiconductor encapsulating epoxy resin compositions which provide cured products having outstanding fire retardance and free of the toxic substance antimony trioxide. The invention also relates to semiconductor devices encapsulated with these compositions in a cured state.

PRIOR ART

The semiconductor devices in use today are predominantly resin encapsulated diodes, transistors, integrated circuit (IC) chips, large scale integration (LSI) chips, and very large scale integration (VLSI) chips. Resin encapsulation is generally carried out with epoxy resin compositions because epoxy resins offer superior properties, (e.g., moldability, adhesion, electrical characteristics, mechanical characteristics, moisture resistance) compared with other thermosetting resins. Since semiconductor devices are used in all areas of our daily lives, including household appliances and computers, semiconductor encapsulants are required to be fire-retarding in the event that a fire occurs.

Halogenated epoxy resins and antimony trioxide ($Sb_2O_3$) are customarily included in epoxy resin compositions to increase the fire retardance. This combination of a halogenated epoxy resin with antimony trioxide has large radical-trapping and air-shielding effects in the vapor phase, thus conferring a high fire-retarding effect. However, halogenated epoxy resins generate noxious gases during combustion, and antimony trioxide has powder toxicity. Given their negative impact on human health and the environment, it would be preferable to entirely exclude these fire retardants from resin compositions.

Not only are resin compositions containing halogenated epoxy resins and antimony trioxide harmful to man and the environment, semiconductor devices encapsulated with these resin compositions have an inferior reliability when exposed to heat and moisture. This poor reliability arises because intermetallic compounds form at the junctions between aluminum electrodes and gold wire on the semiconductor device, causing an increase in electrical resistance and resulting also in wire breaks. The presence of the $Br^-$ or $Sb^+$ ions within the resin composition as part of the fire retardant is known to promote the formation of the intermetallic compounds.

In view of the above, studies have been conducted on the use of hydroxides such as $Al(OH)_3$ and $Mg(OH)_2$ or phosphorus-containing fire retardants in place of halogenated epoxy resins and antimony trioxide. Unfortunately, because of various problems associated with the use of these alternative compounds, such as inferior curability of the resin composition during molding and poor moisture resistance in the cured product, they are not yet ready for practical application.

SUMMARY OF THE INVENTION

It is therefore an object of the present invention to provide semiconductor encapsulating epoxy resin compositions which contain no halogenated epoxy resins or antimony trioxide, and yet have excellent fire retardance and reliability. Another object of the invention is to provide semiconductor devices encapsulated with these resin compositions in a cured state.

Accordingly, this invention provides semiconductor encapsulating epoxy resin compositions comprising (A) an epoxy resin, (B) a phenolic resin curing agent, (C) a fire retardant comprising zinc molybdate carried on spherical silica having a mean particle diameter of 0.2 to 20 µm and a specific surface of 1 to 20 $m^2/g$, and (D) an inorganic filler. These epoxy resin compositions provide cured products having a high fire retardance and excellent reliability, yet containing no halogenated epoxy resin or antimony trioxide.

DETAILED DESCRIPTION OF THE INVENTION

The epoxy resin used as component (A) in this invention may be any epoxy resin having at least two epoxy groups per molecule, other than halogenated epoxy resins. Illustrative examples of suitable epoxy resins include novolac-type epoxy resins such as phenolic novolac epoxy resins and cresol novolac epoxy resins, triphenolalkane epoxy resins, aralkyl epoxy resins, biphenyl skeleton-containing aralkyl epoxy resins, biphenyl epoxy resins, heterocyclic epoxy resins, naphthalene ring-containing epoxy resins, bisphenol-type epoxy resins such as bisphenol A epoxy compounds and bisphenol F epoxy compounds, and stilbene epoxy resins. Any one or combination of two or more of these epoxy resins may be employed.

No particular limit is imposed on the phenolic resin serving as curing agent (B) in the invention, so long as the phenolic resin has at least two phenolic hydroxyl groups in a molecule. Illustrative examples of typical phenolic resin curing agents include novolac-type phenolic resins such as phenolic novolac resins and cresol novolac resins, naphthalene ring-containing phenolic resins, triphenolalkane resins, aralkyl phenolic resins, biphenyl skeleton-containing aralkyl phenolic resins, biphenyl phenolic resins, alicyclic phenolic resins, heterocyclic phenolic resins, naphthalene ring-containing phenolic resins, and bisphenol-type phenolic resins such as bisphenol A and bisphenol F. Any one or combination of two or more of these phenolic resins may be employed.

The relative proportions of the epoxy resin (A) and the phenolic resin curing agent (B) used in the epoxy resin compositions are not subject to any particular limits, although it is preferred that the amount of phenolic hydroxyl groups in the curing agent (B) be from 0.5 to 1.5 moles, and especially 0.8 to 1.2 moles, per mole of epoxy groups in the epoxy resin (A).

The semiconductor encapsulating epoxy resin compositions of the invention do not contain conventional fire retardants such as antimony trioxide and brominated or otherwise halogenated epoxy resins. Instead, the inventive compositions use as the fire retardant (C) a substance prepared by supporting zinc molybdate on spherical silica having a mean particle diameter of 0.2 to 20 µm and a specific surface of 1 to 20 $m^2/g$. Zinc molybdate by itself is known to have a smoke-reducing and charring effect in burning plastic, but it exists in the form of very fine particles and so cannot easily be dispersed in a resin composition. However, by supporting zinc molybdate on spherical silica having a mean particle diameter of 0.2 to 20 µm and a specific surface of 1 to 20 m$^2$/g, there is obtained a fire retardant which is well dispersible in resin compositions. This fire retardant does not cause any loss in flow or curability during molding, and makes it possible to obtain epoxy resin compositions having sufficient fire retardance and excellent reliability in the cured state without using a halogenated epoxy resin or antimony trioxide.

The shape, particle diameter, and distribution of the supporting filler (spherical silica) are crucial for achieving fire retardance using as little zinc molybdate as possible, and for maintaining or enhancing the moldability of the epoxy resin composition.

Therefore, the spherical silica used as the zinc molybdate carrier should have a mean particle diameter of 0.2 to 20 µm, and preferably 0.3 to 10 µm. One of several ways in which the mean particle diameter can be determined is as the weight average value (median diameter) using a particle size distribution measurement apparatus based on the laser light diffraction technique. Particles with a mean particle diameter smaller than 0.2 µm are less dispersible within the resin compositions. A mean particle diameter greater than 20 µm discourages uniform dispersion and support of the zinc molybdate, lowering the fire retardance. This in turn necessitates the use of a larger amount of the fire retardant, which is economically undesirable. The specific surface, as obtained by a suitable technique such as BET adsorption, is from 1 to 20 m$^2$/g, and preferably from 2 to 18 m$^2$/g. Particles with a specific surface of less than 1 m$^2$/g retard the uniform support of zinc molybdate, resulting in a lower fire retardance. On the other hand, at a specific surface above 20 m$^2$/g, dispersibility within the resin composition declines.

The zinc molybdate and the spherical silica serving as the carrier are used in relative proportions such that the content of zinc molybdate based on the total amount of fire retardant (i.e., the total amount of zinc molybdate and the spherical silica serving as the carrier) is preferably 1 to 50% by weight, and more preferably 5 to 40% by weight. A zinc molybdate content of less than 1% by weight would be difficult to achieve sufficient fire retardance, whereas a content greater than 50% by weight would make uniform support of the zinc molybdate on the spherical silica difficult to achieve.

The amount of fire retardant (i.e., the total amount of zinc molybdate and the spherical silica serving as the carrier) in the epoxy resin compositions of the invention is preferably 1 to 300 parts by weight, more preferably 3 to 200 parts by weight, and most preferably 5 to 100 parts by weight, per 100 parts by weight of the epoxy resin and the phenolic resin curing agent combined. Less than 1 part by weight of the fire retardant would fail to achieve a sufficient fire-retarding, whereas the use of more than 300 parts by weight would adversely affect the flow and curability of the composition during molding.

The zinc molybdate content within the fire retardant (i.e., the total amount of zinc molybdate and the spherical silica serving as the carrier) is preferably 0.02 to 35 parts by weight, more preferably 0.1 to 30 parts by weight, and most preferably 0.5 to 25 parts by weight, per 100 parts by weight of the epoxy resin and the phenolic resin curing agent combined. Less than 0.02 part by weight of zinc molybdate would fail to achieve a sufficient fire-retarding effect, whereas the inclusion of more than 35 parts by weight would lower the flow and curability of the composition during molding.

Within the fire retardant used herein, the uranium content is preferably not more than 10 ppb. At a uranium content higher than 10 ppb, the uranium content in the resulting epoxy resin composition becomes high enough for soft errors caused by α rays to arise in the semiconductor device when the composition is used as a memory chip encapsulant. To ensure that the fire retardant has a uranium content no higher than 10 ppb, a low α ray-grade spherical silica having a uranium content of less than 1 ppb is preferable for supporting the zinc molybdate.

The fire retardant used herein is an extremely effective fire retardant which has not been found to have a powder toxicity like that of antimony trioxide. Examples of commercial products that may be used as this fire retardant include Kemgard series such as Kemgard 1260, 1261, 1270, and 1271, all available from Sherwin-Williams Co.

The inorganic filler (D) included in the epoxy resin compositions of the invention may be any suitable inorganic filler other than the above-said component (C) commonly used in epoxy resin compositions. Illustrative examples include silicas such as fused silica and crystalline silica, alumina, silicon nitride, aluminum nitride, boron nitride, titanium oxide, and glass fibers. No particular limit is imposed on the mean particle diameter and shape of these inorganic fillers, although the use of spherical fused silica having a mean particle diameter of 5 to 40 µm is preferred because it endows the epoxy resin composition with good molding and flow characteristics.

The inventive epoxy resin compositions have inorganic filler loadings of preferably 400 to 1,200 parts, more preferably 450 to 1,000 parts by weight per 100 parts by weight of the epoxy resin and the phenolic resin curing agent combined. At less than 400 parts by weight, the epoxy resin combination would have a large coefficient of expansion, resulting in greater stress on the semiconductor device and a decline in the device characteristics. Moreover, the proportion of resin relative to the overall composition becomes larger, sometimes failing to attain the fire retardance that is the object of this invention. On the other hand, more than 1,200 parts by weight of the inorganic filler would result in an excessive rise in viscosity during molding, and thus a poor moldability. The content of inorganic filler within the epoxy resin composition (excluding the above-described fire retardant (C)) is preferably 55 to 92% by weight, and especially 57 to 90% by weight.

The inorganic filler used herein is preferably surface treated beforehand with a coupling agent such as a silane coupling agent or a titanate coupling agent in order to increase the bonding strength between the resin and the inorganic filler. Preferred examples of such coupling agents include epoxy group-containing silanes such as γ-glycidoxypropyltrimethoxysilane, γ-glycidoxypropylmethyldiethoxysilane, and β-(3,4-epoxycyclohexyl)ethyltrimethoxysilane; amino group-containing silanes such as N-β-(aminoethyl)-γ-aminopropyltrimethoxysilane, γ-aminopropyltriethoxysilane, and N-phenyl-γ-aminopropyltrimethoxysilane; and mercaptosilanes such as γ-mercaptopropyltrimethoxysilane and γ-mercaptopropylmethyldimethoxysilane. No particular limitation is imposed on the amount of coupling agent used for surface treatment or the method of surface treatment.

In the practice of this invention, use is preferably made of a curing accelerator to promote the curing reaction between the epoxy resin and the curing agent. The curing accelerator may be any suitable substance that promotes the curing reaction. Illustrative, non-limiting examples of curing accelerators that may be used include phosphorus compounds such as triphenylphosphine, tributylphosphine, tri(p-methylphenyl)phosphine, tri(nonylphenyl)phosphine, triphenylphosphine triphenylborane, and tetraphenylphosphine tetraphenylborate; tertiary amine compounds such as triethylamine, benzyldimethylamine, α-methylbenzyldimethylamine, and 1,8-diazabicyclo[5.4.0]undecene-7; and imidazole compounds such as 2-methylimidazole, 2-phenylimidazole, and 2-phenyl-4-methylimidazole.

The semiconductor encapsulating epoxy resin compositions of the invention may also include various additives, if necessary. Illustrative examples include stress-lowering additives such as thermoplastic resins, thermoplastic elastomers, synthetic organic rubbers, and silicones; waxes such as carnauba wax, higher fatty acids, and synthetic waxes; colorants such as carbon black; and halogen trapping agents.

The inventive epoxy resin compositions may be prepared by compounding the epoxy resin, curing agent, inorganic filler, and other components in predetermined proportions, thoroughly mixing these components together in a mixer or other appropriate apparatus, then melting and working the resulting mixture using hot rolls, a kneader, an extruder or the like. The worked mixture is then cooled and solidified, and subsequently milled to a suitable size so as to give a molding material.

The resulting epoxy resin compositions of the invention can be effectively used for encapsulating various types of semiconductor devices. The method of encapsulation most commonly used is low-pressure transfer molding. The epoxy resin composition of the invention is preferably molded at a temperature of about 150 to 180° C. for a period of about 30 to 180 seconds, followed by postcuring at about 150 to 180° C. for about 2 to 16 hours.

The semiconductor encapsulating epoxy resin compositions of the invention cure into products which have an excellent fire retardance. Owing to the absence of halogenated epoxy resins and antimony trioxide, the epoxy resin compositions have no adverse impact on human health or the environment. Moreover, these resin compositions have good flow and curing properties when molded, and provide excellent reliability in the cured state.

EXAMPLE

Examples of the invention and comparative examples are given below by way of illustration, and are not intended to limit the invention. All parts in the examples are by weight.

Examples 1 to 7, Comparative Examples 1 to 4

The respective combinations of components shown in Tables 1 and 2 were uniformly melted and worked a hot two-roll mill, then cooled and milled to give semiconductor encapsulating epoxy resin compositions. The following starting materials were used.

Epoxy Resins:

(a) EOCN1020–55, an o-cresol novolac epoxy resin produced by Nippon Kayaku Co., Ltd. (epoxy equivalent, 200)

(b) YX40000HK, a biphenyl epoxy resin produced by Yuka Shell Epoxy (epoxy equivalent, 190)

(c) NC-3000P, an epoxy resin of formula (1) produced by Nippon Kayaku Co., Ltd. (epoxy equivalent, 272)

(1)

In the formula, n has an average value of 0.74.

Curing Agents:

(d) DL-92, a phenolic novolac resin produced by Meiwa Kasei Industries, Ltd. (phenolic hydroxy equivalent, 110)

(e) MEH-7800SS, a phenolic aralkyl resin produced by Meiwa Kasei Industries, Ltd. (phenolic hydroxy equivalent, 175)

(f) MEH-7851L, a phenolic resin of formula (2) produced by Meiwa Kasei Industries, Ltd. (phenolic hydroxy equivalent, 199)

(2)

In the formula, m has an average value of 0.44.

Zinc Molybdate-Treated Silica

Admafine LSO-25H (spherical silica with a mean particle diameter of 0.5 $\mu$m and a specific surface area by BET adsorption method of 14 $m^2$/g produced by Admatechs Co., Ltd.) treated with 19% by weight of zinc molybdate Inorganic Filler Spherical fused silica produced by Tatsumori Ltd. (mean particle diameter, 20 $\mu$m)

Curing Accelerator

Triphenylphosphine (Hokko Chemical Industry Co., Ltd.)

Parting Agent

Carnauba wax (Nikko Fine Products, Ltd.)

Silane Coupling Agent

KBM-403, a γ-glycidoxypropyltrimethoxysilane produced by Shin-Etsu Chemical Co., Ltd.

These compositions were measured for the following properties. The results are given in Tables 1 and 2.

(1) Spiral Flow

Measured by molding at 175° C. and 70 kgf/$cm^2$ for a molding time of 120 seconds using a mold in accordance with EMMI standards.

(2) Hardness When Molded

Using the method described in JIS-K6911, a rod measuring 10×4×100 mm was molded at 175° C. and 70 kgf/$cm^2$ for a time of 90 seconds. The hardness when hot was measured with a Barcol Impressor.

(3) Fire Retardance

A 1/16 inch thick sheet was molded and the fire retardance of the sheet was rated in accordance with UL 94 test specifications.

(4) Moisture Resistance

A silicon chip measuring 6×6 mm on which aluminum wiring had been formed was adhesively bonded to a 14-pin dual in-line package (DIP) frame (Alloy 42), and the aluminum electrodes on the chip surface were wire bonded to the lead frame using 30 $\mu$m gold wire. The epoxy resin composition was then molded over the chip at 175° C. and 70 kgf/$cm^2$ for a time of 120 seconds, and post-cured at 180° C. for 4 hours. Twenty packages thus obtained were left to stand for 500 hours at 140° C. and 85% relative humidity while being subjected to a bias voltage of 5V DC. The number of packages in which aluminum corrosion arose was counted.

TABLE 1

| Ingredients (parts by weight) | Ex. 1 | Ex. 2 | Ex. 3 | Ex. 4 | Ex. 5 | Ex. 6 | Ex. 7 |
|---|---|---|---|---|---|---|---|
| Epoxy resin (a) | 64.6 | 64.6 | — | — | — | — | — |
| Epoxy resin (b) | — | — | 52.1 | 52.1 | — | — | 16.4 |
| Epoxy resin (c) | — | — | — | — | 57.8 | 57.8 | 38.4 |
| Phenolic resin curing agent (d) | 35.4 | 35.4 | — | — | — | — | — |
| Phenolic resin curing agent (e) | — | — | 47.9 | 47.9 | — | — | — |
| Phenolic resin curing agent (f) | — | — | — | — | 42.2 | 42.2 | 42.2 |
| Inorganic filler | 500 | 500 | 850 | 850 | 800 | 700 | 700 |
| Curing accelerator | 1.2 | 1.2 | 1.2 | 1.2 | 1.2 | 1.2 | 1.2 |
| Zinc molybdate-treated silica | 100 | 5 | 100 | 5 | 1 | 5 | 5 |
| (zinc molybdate content, pbw) | (19) | (0.95) | (19) | (0.95) | (0.19) | (0.95) | (0.95) |
| Zinc molybdate | — | — | — | — | — | — | — |
| Aluminum hydroxide | — | — | — | — | — | — | — |
| Antimony trioxide | — | — | — | — | — | — | — |
| Brominated epoxy resin | — | — | — | — | — | — | — |
| Parting agent | 3 | 3 | 3 | 3 | 3 | 3 | 3 |
| Carbon black | 2 | 2 | 2 | 2 | 2 | 2 | 2 |
| Silane coupling agent | 1 | 1 | 1 | 1 | 1 | 1 | 1 |
| Properties | | | | | | | |
| Spiral flow (cm) | 100 | 100 | 120 | 120 | 80 | 90 | 100 |
| Hardness when molded | 80 | 80 | 85 | 85 | 80 | 80 | 75 |
| Fire retardance | V-0 | V-0 | V-0 | V-0 | V-0 | V-0 | V-0 |
| Moisture resistance | 0/20 | 0/20 | 0/20 | 0/20 | 0/20 | 0/20 | 0/20 |

TABLE 2

| Ingredients (parts by weight) | CE 1 | CE 2 | CE 3 | CE 4 |
|---|---|---|---|---|
| Epoxy resin (a) | 64.6 | — | — | — |
| Epoxy resin (b) | — | — | 52.1 | 52.1 |
| Epoxy resin (c) | — | 57.8 | — | — |
| Phenolic resin curing agent (d) | 35.4 | — | — | — |
| Phenolic resin curing agent (e) | — | — | 47.9 | 47.9 |
| Phenolic resin curing agent (f) | — | 42.2 | — | — |
| Inorganic filler | 500 | 800 | 850 | 850 |
| Curing accelerator | 1.2 | 1.2 | 1.2 | 1.2 |
| Zinc molybdate-treated silica | — | — | — | — |
| (zinc molybdate content, pbw) | (—) | (—) | (—) | (—) |
| Zinc molybdate | — | 0.95 | — | — |
| Aluminum hydroxide | — | — | — | 50 |
| Antimony trioxide | — | — | 4 | — |
| Brominated epoxy resin | — | — | 6.2 | — |
| Parting agent | 3 | 3 | 3 | 3 |
| Carbon black | 2 | 2 | 2 | 2 |
| Silane coupling agent | 1 | 1 | 1 | 1 |
| Properties | | | | |
| Spiral flow (cm) | 100 | 40 | 125 | 100 |
| Hardness when molded | 80 | 80 | 85 | 40 |
| Fire retardance | burned | V-0 | V-0 | V-0 |
| Moisture resistance | 0/20 | 0/20 | 20/20 | 20/20 |

From Tables 1 and 2, it is apparent that the semiconductor encapsulating epoxy resin compositions of the invention are able to provide cured products which have excellent fire retardance. The resin compositions have no ill effects on human health and the environment because they contain no halogenated epoxy resins or antimony trioxide. Moreover, these epoxy resin compositions have good flow and curing properties when molded, as well as excellent reliability.

Semiconductor devices encapsulated with the epoxy resin compositions of the invention are fully fire retardant and highly reliable.

Examples 8 to 11, Comparative Examples 5 to 7

In these examples, spherical silica having different mean particle diameters and crushed silica obtained by milling were used as the zinc molybdate-supporting silica. Zinc molybdate was supported on these silicas in the concentrations shown in Table 3.

TABLE 3

| Supporting silica | A | B | C | D | E | F |
|---|---|---|---|---|---|---|
| Mean particle size (μm) | 1 | 5 | 15 | 30 | 0.5 | 0.1 |
| Shape | spherical | spherical | spherical | spherical | crushed | spherical |
| Specific surface (m$^2$/g) | 6 | 2.5 | 1.7 | 1.2 | 18 | 35 |
| Concentration of zinc molybdate (%) | 30 | 20 | 10 | 20 | 20 | 20 |

The zinc molybdate-treated silicas shown in Table 3 were compounded as the fire retardant with the other ingredients shown in Table 4. The ingredients in each case were uniformly melted and worked together in a hot two-roll mill, then cooled and milled to give semiconductor encapsulating epoxy resin compositions. The same starting materials as indicated above were used here to obtain these compositions.

TABLE 4

| Ingredients (pbw) | Ex. 8 | Ex. 9 | Ex. 10 | Ex. 11 | CE 5 | CE 6 | CE 7 |
|---|---|---|---|---|---|---|---|
| Epoxy resin (a) | 64.6 | — | 64.6 | — | 64.6 | 64.6 | — |
| Epoxy resin (b) | — | 52.1 | — | — | — | — | 52.1 |
| Epoxy resin (c) | — | — | — | 57.8 | — | — | — |
| Phenolic resin curing agent (d) | 35.4 | — | 35.4 | — | 35.4 | 35.4 | — |

TABLE 4-continued

| Ingredients (pbw) | Ex. 8 | Ex. 9 | Ex. 10 | Ex. 11 | CE 5 | CE 6 | CE 7 |
|---|---|---|---|---|---|---|---|
| Phenolic resin curing agent (e) | — | 47.9 | — | — | — | — | 47.9 |
| Phenolic resin curing agent (f) | — | — | — | 42.2 | — | — | — |
| Inorganic filler | 500 | 850 | 400 | 700 | 500 | 500 | 850 |
| Curing accelerator | 1.2 | 1.2 | 1.2 | 1.2 | 1.2 | 1.2 | 1.2 |
| Zinc molybdate-treated silica (A) | — | 5 | — | — | — | — | — |
| Zinc molybdate-treated silica (B) | 70 | — | — | — | — | — | — |
| Zinc molybdate-treated silica (C) | — | — | 200 | 10 | — | — | — |
| Zinc molybdate-treated silica (D) | — | — | — | — | 100 | — | — |
| Zinc molybdate-treated silica (E) | — | — | — | — | — | 100 | — |
| Zinc molybdate-treated silica (F) | — | — | — | — | — | — | 5 |
| Parting agent | 3 | 3 | 3 | 3 | 3 | 3 | 3 |
| Carbon black | 2 | 2 | 2 | 2 | 2 | 2 | 2 |
| Silane coupling agent | 1 | 1 | 1 | 1 | 1 | 1 | 1 |
| Properties | | | | | | | |
| Spiral flow (cm) | 105 | 115 | 106 | 95 | 85 | 28 | 49 |
| Hardness when molded | 83 | 85 | 84 | 82 | 82 | 80 | 76 |
| Fire retardance | V-0 | V-0 | V-0 | V-0 | burned | V-0 | V-0 |
| Moisture resistance | 0/20 | 0/20 | 0/20 | 0/20 | 0/20 | 0/20 | 5/20 |

As can be seen from the results shown in Table 4, the silica with a mean particle diameter of 0.1 μm used in Comparative Example 7 had too large a surface area (or too small a mean particle size), resulting in poor wettability with the resin, poor flow by the composition, and poor moisture resistance in the cured product. In Comparative Example 6, the epoxy resin composition containing a large amount of crushed silica lacked flowability, resulting in poor molding properties. In Comparative Example 5, the use of spherical silica having a large mean particle diameter of 30 μm resulted in a lack of uniform dispersibility and poor fire retardance. Hence, it is apparent that semiconductor encapsulating epoxy resin compositions of good moldability and moisture resistance can be obtained by using as the fire retardant spherical silica having a mean particle diameter of 0.2 to 20 μm which has been treated with zinc molybdate.

Japanese Patent Application No. 132715/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition comprising:
    (A) an epoxy resin,
    (B) a phenolic resin curing agent,
    (C) a fire retardant comprising zinc molybdate carried on spherical silica having a mean particle diameter of 0.2 to 20 μm and a specific surface of 1 to 20 m²/g, and
    (D) an inorganic filler.

2. The semiconductor encapsulating epoxy resin composition of claim 1, wherein the fire retardant (C) is included in an amount of 1 to 300 parts by weight per 100 parts by weight of the epoxy resin (A) and the phenolic resin curing agent (B) combined.

3. The semiconductor encapsulating epoxy resin composition of claim 1, wherein the fire retardant (C) has a zinc molybdate content of 0.02 to 35 parts by weight per 100 parts by weight of the epoxy resin (A) and the phenolic resin curing agent (B) combined.

4. The semiconductor encapsulating epoxy resin composition of claim 1, wherein the fire retardant (C) has a uranium content of not more than 10 ppb.

5. A semiconductor device encapsulated with the semiconductor encapsulating epoxy resin composition of claim 1 in a cured state.

6. The semiconductor encapsulating epoxy resin composition of claim 1, wherein the spherical silica has a mean particle diameter of 0.3 to 10 μm.

7. The semiconductor encapsulating epoxy resin composition of claim 1, wherein the spherical silica has a specific surface of 2 to 18 m²/g.

8. The semiconductor encapsulating epoxy resin composition of claim 1, wherein the content of zinc molybdate based on the total amount of zinc molybdate and the spherical silica serving as the carrier is 1 to 50% by weight.

9. The semiconductor encapsulating epoxy resin composition of claim 2, wherein the fire retardant is included in an amount of 5 to 100 parts by weight per 100 parts by weight of the epoxy resin and the phenolic resin curing agent combined.

10. The semiconductor encapsulating epoxy resin composition of claim 3, wherein the fire retardant has a zinc molybdate content of 0.5 to 25 parts by weight per 100 points by weight of the epoxy resin and the phenolic resin curing agent combined.

11. The semiconductor encapsulating epoxy resin composition of claim 1, wherein the amount of phenolic hydroxyl groups inphenolic resin curing agent (B) is from 0.8 to 1.2 moles per mole of epoxy groups in epoxy resin (A).

12. The semiconductor encapsulating epoxy resin composition of claim 1, wherein inorganic filler (D) comprises a spherical fused silica having a mean particle diameter of 5 to 40 μm.

* * * * *